United States Patent
Bruno

(10) Patent No.: US 7,157,899 B2
(45) Date of Patent: Jan. 2, 2007

(54) PRIORITIZED INTERRUPT FOR WAVEFORM MEASUREMENT

(75) Inventor: David A. Bruno, Portland, OR (US)

(73) Assignee: Veris Industries, LLC, Portland, OR (US)

( * ) Notice: Subject to any disclaimer, the term of this patent is extended or adjusted under 35 U.S.C. 154(b) by 0 days.

(21) Appl. No.: 11/026,856

(22) Filed: Dec. 29, 2004

(65) Prior Publication Data

US 2006/0091828 A1   May 4, 2006

Related U.S. Application Data

(60) Provisional application No. 60/620,111, filed on Oct. 18, 2004.

(51) Int. Cl.
*G01R 11/32* (2006.01)
*H05B 37/02* (2006.01)

(52) U.S. Cl. ........................ 324/142; 315/292

(58) Field of Classification Search ............ 324/76.13, 324/76.15, 76.16, 76.38–82, 126, 141–142; 315/292; 702/61
See application file for complete search history.

(56) References Cited

U.S. PATENT DOCUMENTS

| | | | |
|---|---|---|---|
| 5,079,510 A * | 1/1992 | Komatsu et al. | 324/142 |
| 5,122,735 A * | 6/1992 | Porter et al. | 324/142 |
| 5,548,209 A * | 8/1996 | Lusignan et al. | 324/142 |
| 5,920,190 A * | 7/1999 | Peterson et al. | 324/126 |
| 6,308,140 B1 * | 10/2001 | Dowling et al. | 702/60 |
| 6,657,424 B1 * | 12/2003 | Voisine et al. | 324/76.11 |
| 6,889,271 B1 * | 5/2005 | Germer et al. | 710/62 |
| 7,006,934 B1 * | 2/2006 | Jonker et al. | 702/61 |

OTHER PUBLICATIONS

Ganssie, "Interrupt Latency," Embedded.com, www.embedded.com/show Article..jhmtl?articleID=9900320, Aug. 26, 2004.
AT91M42800A Summary, "AT91 ARM Thumb Microcontrollers," Atmel, Feb. 2002.

* cited by examiner

*Primary Examiner*—Hung Tran Vy
(74) *Attorney, Agent, or Firm*—Chernoff, Vilhauer, McClung & Stenzel

(57) ABSTRACT

An interrupt request is asserted in anticipation of a period of latency preceding preparedness of a power meter data processing device to sample a voltage or current enabling the use an interrupt to control the data processing device's performance of real-time sampling in combination with other tasks related to the power meter's operation.

3 Claims, 4 Drawing Sheets

PRIORITIZED INTERRUPT FOR WAVEFORM MEASUREMENT

CROSS-REFERENCE TO RELATED APPLICATIONS

This application claims the benefit of U.S. patent application Ser. No. 60/620,111 filed Oct. 18, 2004.

STATEMENT REGARDING FEDERALLY SPONSORED RESEARCH OR DEVELOPMENT

Not applicable.

BACKGROUND OF THE INVENTION

The present invention relates to a method and apparatus for measuring a waveform and, more particularly, to an electricity metering method and apparatus using a data processor interrupt to initiate sampling of voltage and current waveforms.

Electric power is typically generated at a remote, central generating facility and transported to the consumer over a distribution system. To reduce power transportation losses, a step-up, subtransmission transformer is used to increase the voltage and reduce the current for transmission over a transmission line. The actual transmission line voltage usually depends on the distance between the subtransmission transformers and the consumers of the electricity but is commonly in the range of 2–35 kilo-volts ("kV"). Distribution substation transformers and distribution transformers of an electric utility's secondary power distribution system reduce the voltage from the transmission line level to a distribution voltage for delivery and use by industrial, commercial, and residential consumers. In the United States, for example, electric power is typically delivered to the consumer as an alternating current (AC) voltage ranging from 120 volts ("V") to 660 V, depending upon the use. As generated, the fundamental AC voltage and current approximate "in-phase," 60 Hertz ("Hz") sine waves over time.

The consumption of power by individual consumers and the performance of the distribution system are monitored by power meters. Power meters are used to monitor a number of electrical parameters related to power distribution and use, including the active power, the time rate of transferring or transforming energy, and the apparent power, the product of the root mean square (RMS) voltage and current. In addition, the reactive power, the product of the RMS voltage and the quadrature component of the current, and the power factor or quality factor, the ratio of active power to apparent power, are commonly monitored. The usefulness of monitoring a variety of electric power parameters has favored adoption of digital power meters that incorporate digital data processing systems. In a digital power meter, the voltage and current waveforms are captured as digital data and the data processing system calculates the various electric power parameters from the digital waveform data using appropriate mathematical formulas that are typically stored in the meter.

Referring to FIG. 1, the effective power of the analog sinusoidal voltage 20 and current 22 waveforms is the integral of the product of the instantaneous magnitudes of the voltage and current averaged over a time period, usually a cycle of the waveform:

$$P = \frac{1}{T}\int_0^T (v(t)i(t))\,dt \qquad (1)$$

where:
v(t)=instantaneous voltage at time t
i(t)=instantaneous current at time t
T=time period, typically a waveform cycle period In a digital power meter, the sinusoidal analog voltage 20 and current 22 waveforms are digitally captured by periodically sampling the amplitude of the outputs of voltage and current transducers which produce signals representative of the voltage and current, respectively, in a transmission line conducting power to a load. The effective power is typically approximated by averaging the sum of the products of the respective instantaneous voltage and current samples for each of the plurality of sampling intervals making up at least one cycle of the waveform:

$$P \cong \frac{1}{T}\sum_{k=1}^{k=\frac{T}{\Delta t}} v(k)i(k)\Delta t \qquad (2)$$

where:
v(k)=sample voltage for the k-th sample, for example voltage 24
i(k)=sample current for the k-th sample, for example current 26
Δt=sampling interval Accurate measurement of the various electrical parameters, including effective power, with a digital power meter requires accurate control of the sampling interval. Typically, digital electric power meters include a sampling unit for each phase of the single phase or 3-phase current carried by the transmission line. The sampling unit controls and performs the sampling and digitizing of the voltage and current waveforms. A sampling unit typically comprises a voltage transducer, a current transducer, an analog-to-digital converter (ADC) to convert the instantaneous amplitudes of the voltage or current samples to discrete digital signals of finite precision; one or more digital signal processors (DSP) to read and store the digital values of the voltage and current samples and a sampling clock to provide a precise sampling interval to the ADC and DSP. Typically, a DSP dedicated to the task of reading and storing the sample values of the voltage and current polls the ADC or responds to an interrupt initiated by the sampling clock to read the ADC.

The processing power of microprocessors has significantly increased and microprocessors are available with sufficient processing power to perform the sampling of the voltage and current waveforms as well as the other tasks related to the operation of a power meter. Microprocessors are often used to perform a plurality of tasks that may occur coincidently and commonly use interrupts to determine the order of performance of the various tasks. A microprocessor responds to an interrupt request signal, usually from external hardware, by suspending processing of a lower priority task; storing addresses for the interrupted program instructions and any intermediate results of the suspended task; and initiating processing of the interrupt service routine, the program instructions for the higher priority interrupting task. Upon completion of the interrupting task, the microprocessor returns to the interrupted task and, unless a higher priority, second interrupt has been received, continues processing the interrupted task. While microprocessors are commonly used to perform multiple tasks, interrupt latency makes combining the real time tasks, such as those performed by the sampling unit of a power meter, with the other data processing tasks related to meter operation problematic. Interrupt latency refers to the time interval between the assertion of an interrupt and the initiation of the interrupt service routine for the asserted interrupt. Interrupt latency makes the timing of the initiation of the execution of the interrupt uncertain, making the timing of real-time tasks, such as sampling unreliable, and, as a result, potentially making the output of the meter inaccurate. If a data processing device could perform sampling as well as other power meter tasks, a digital signal processor dedicated to the sampling task would be unnecessary and the cost of digital power meters could be significantly reduced.

What is desired, therefore, is a method and apparatus for periodically sampling an electrical waveform with a data processor that performs tasks other than waveform sampling.

DETAILED DESCRIPTION OF THE INVENTION

Figure 1:
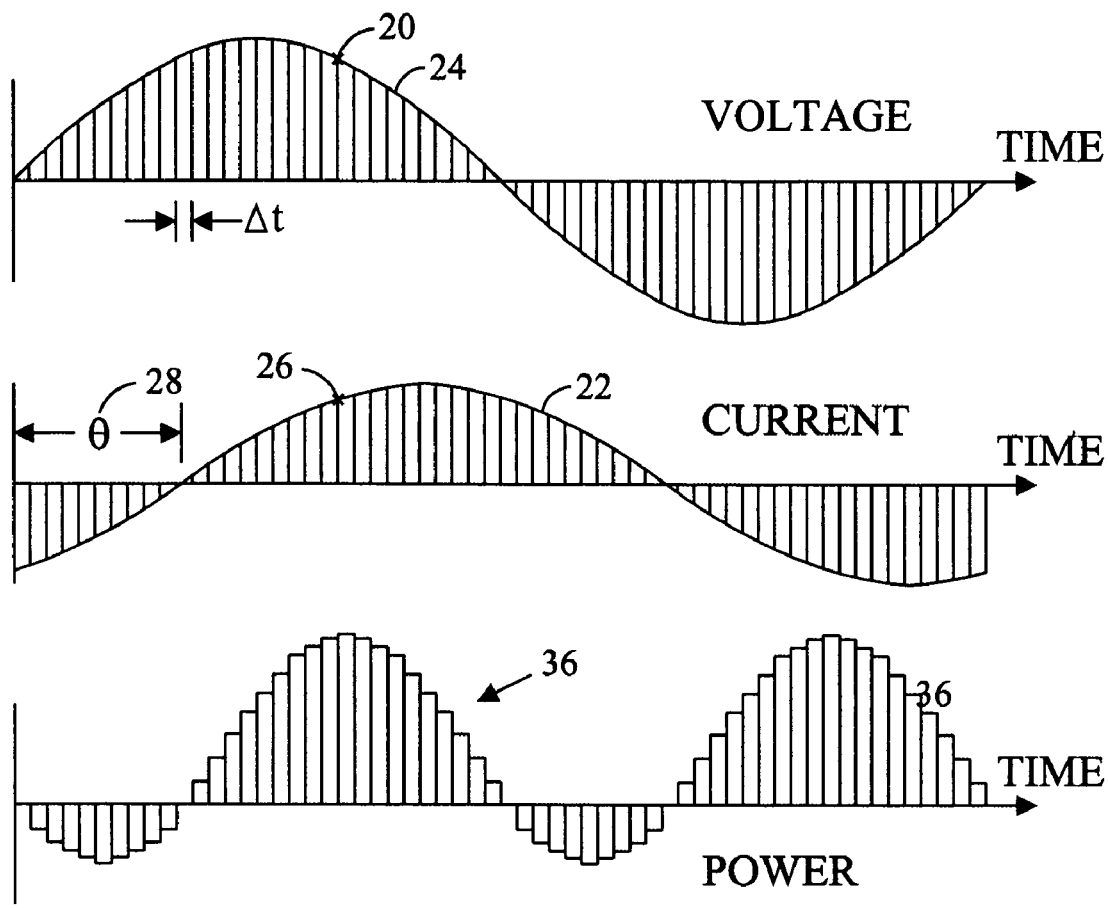
FIG. 1 is a pictorial representation of a calculation of electric power from the results of periodic sampling of voltage and current sine waves.

Referring in detail to the drawings where similar parts of the invention are identified by like reference numerals, and, more particularly, to FIG. 1 electric power is commonly generated and delivered to a consumer as an alternating current (AC) voltage. An AC waveform is a periodic waveform comprising a plurality of substantially similar cycles that approximates a sine wave with time. As generated and delivered to the electrical distribution system, the AC voltage 20 and current 22 sine waves are expected to have a particular frequency known as the fundamental frequency. In the United States, the fundamental frequency is typically 60 Hz.

The sinusoidal AC voltage 20 and current 22 waveforms are defined, respectively, by the equations:

$$v = V_m \cos(\omega t + \theta_v) \tag{3}$$

$$i = I_m \cos(\omega t + \theta_i) \tag{4}$$

where:
v=instantaneous voltage
$V_m$=maximum voltage of the fundamental waveform
i=instantaneous current
$I_m$=maximum current of the fundamental waveform
ω=angular frequency of the sinusoidal function
$\theta_v$=phase angle of the sinusoidal voltage
$\theta_i$=phase angle of the sinusoidal current The voltage and current phase angles ($\theta_v$, $\theta_i$) express the amplitude of the respective waveform at the time that a measurement is initiated (t=0). Since the position of the time axis is arbitrary, either the voltage phase angle ($\theta_v$) or the current phase angle ($\theta_i$) is commonly assumed to be zero and the phase angle 28 or phase (θ) expresses the relative angular relationship, and, therefore, the relative temporal relationship of a distinguishing feature of two periodic waveforms, as indicated by the following:

$$v = V_m \cos(\omega t) \tag{5}$$

$$i = I_m \cos(\omega t + \theta) \tag{6}$$

As generated, the voltage and current are "in phase" (θ=0) and the zero amplitude crossings and amplitude peaks of the AC waveforms occur simultaneously. If the load is purely resistive, the voltage and current remain in-phase. However, if the load is capacitive, the phase distinguishing feature of the current waveform will precede that of the voltage waveform and the phase angle is designated as leading. On the other hand, an inductive load produces a lagging phase angle with the phase distinguishing feature of the voltage waveform preceding that of the current waveform.

The effective power of in-phase, analog sinusoidal voltage and current waveforms is the integral of the product of the instantaneous magnitudes of the voltage and current averaged over a time period, usually a cycle of the waveform:

$$P = \frac{1}{T} \int_0^T (v(t)i(t)) dt \tag{1}$$

where:
v(t)=instantaneous voltage at time t
i(t)=instantaneous current at time t
T=time period, typically a waveform cycle period Increasingly loads imposed on electrical distribution systems comprise power electronic loads, including AC and DC variable speed drives, power rectifiers and inverters, arc furnaces, and discharge lighting, such as fluorescent lighting. Typically, power electronic loads include a front end section comprising a rectification bridge and a parallel input filter capacitor. The front end section acts as a peak detector because current flows to charge the capacitor only during a portion of each half cycle of the sine wave when the instantaneous AC voltage exceeds the voltage on the capacitor. Between these current peaks, the load draws energy stored in the capacitor.

Figure 2:
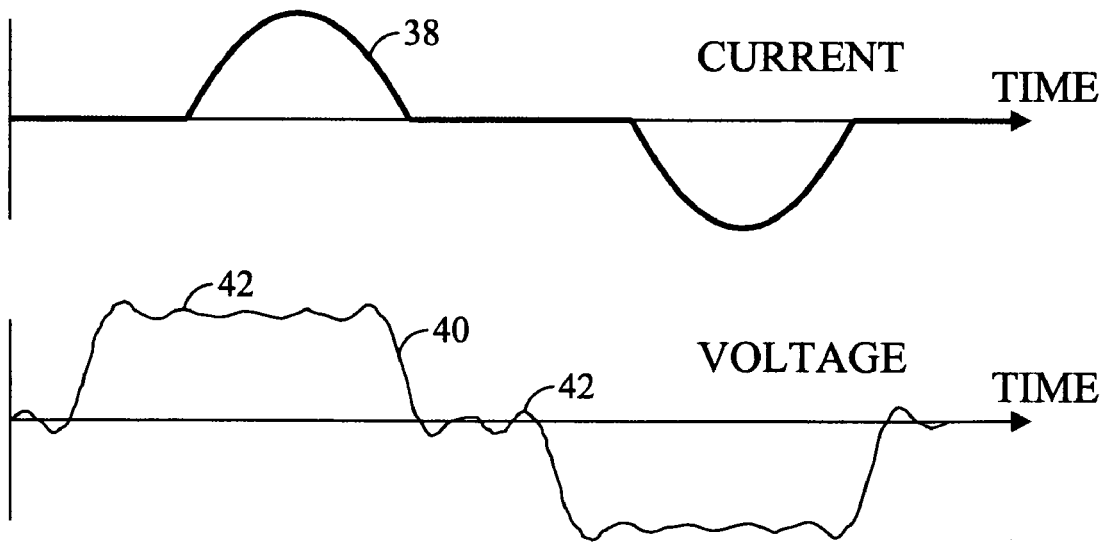
FIG. 2 is a pictorial representation of a harmonically distorted voltage sine wave.

Referring to FIG. 2, power electronic loads draw current in short abrupt pulses 38 rather than in a smooth sinusoidal manner and are referred as non-linear loads. The current flow to a non-linear load is not proportional to the instantaneous voltage and is not sinusoidal. When connected to a sinusoidal voltage, non-linear power electronic loads produce harmonics of the fundamental voltage sine wave. The expected frequency of the voltage or current is conventionally referred to as the "fundamental" frequency, regardless of the actual spectral peak, and integer multiples of this fundamental frequency are usually referred to as harmonic frequencies or harmonics.

The specific harmonics produced by a power electronic load are determined by the number of rectifiers (pulse number) used in the rectification circuit and can be determined by the equation:

$$h = (n \times p) \pm 1 \quad (7)$$

where: n=an integer (1, 2, 3 . . . )
p=number of pulses or rectifiers

For example, a typical six-pulse rectifier commonly used in a 3-phase, 60 Hz circuit produces odd harmonics, including fifth and seventh harmonics (h=(1×6)±1) (300 Hz and 420 Hz); eleventh and thirteenth harmonics (660 Hz and 780 Hz); seventeenth and nineteenth harmonics (1020 Hz and 1140 Hz), and twenty-third and twenty-fifth harmonics (1380 Hz and 1500 Hz). When a fundamental waveform is combined with its harmonics, the instantaneous amplitude of the resulting waveform comprises a sum incorporating the instantaneous amplitudes of the fundamental wave and each of the harmonic waves. A fundamental sine wave 20 is significantly distorted 40 when combined with its fifth, seventh, eleventh, and thirteenth harmonics. In addition, the harmonic distortion produces a succession of localized amplitude peaks 42, particularly in the vicinities of the expected zero crossings and amplitude peaks of the fundamental waveform and, as a result, the harmonically distorted waveform 40 typically includes a plurality contemporaneous zero crossings and amplitude peaks.

In a digital power meter the effective power 36 is typically approximated by averaging the sum of the products of the instantaneous voltage, for example instantaneous voltage 24, and current, for example instantaneous current 26, for each of a plurality of sampling intervals 30 making up at least one cycle of the waveform:

$$P \cong \frac{1}{T} \sum_{k=1}^{k=\frac{T}{\Delta t}} v(k) i(k) \Delta t \quad (2)$$

where:
v(k)=instantaneous voltage for the k-th sample
i(k)=instantaneous current for the k-th sample
Δt=sampling interval To accurately determine the power, the sampling intervals 30 must be accurate. If the time between samples varies, sampling will be temporally shifted and the voltage and current waveforms described by sample data will be distorted producing inaccurate meter readings. Uniform sampling intervals are even more important if the waveform is harmonically distorted because sample values change rapidly and can not be inferred from temporally adjacent samples.

Figure 3:
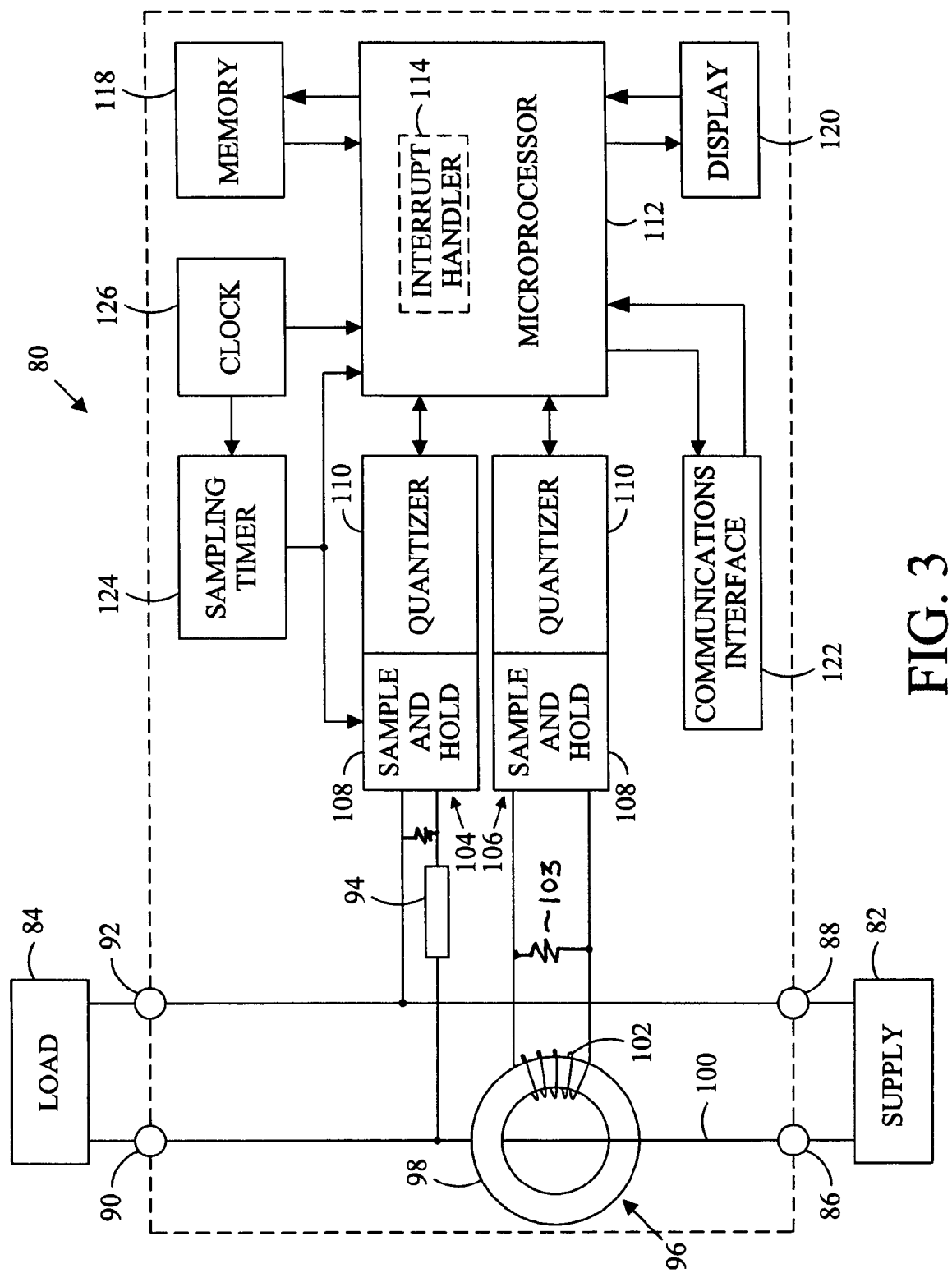
FIG. 3 is a schematic representation of an electric power meter.

Referring to FIG. 3, electric power consumption is commonly monitored by a digital electrical power meter 80 adapted for connection between a supply 82 and a load (or loads) 84 of an electrical distribution system via input terminals 86, 88 and output terminals 90, 92. The supply voltage is sensed through a voltage transducer 94, such as a voltage divider network, and the load current is sensed by a current transducer 96, commonly a current transformer. A current transformer typically comprises a toroidal core 98 with conductive wire wrapped around the cross-section of the core to form a secondary winding 102. A conductor 100 connecting the supply terminal 86 to the load terminal 90 and passing through the aperture in the center of the toroidal core 98 comprises the primary winding of the current transformer 96. The primary winding has $N_1$ turns (commonly, $N_1$=1) and the secondary winding has $N_2$ turns and, thus, the current transformer 96 has a turns ratio (n) of $N_1/N_2$. Current passing through a primary winding induces a current in the secondary winding. A burden resistor 103 converts this secondary current to a voltage, from which the amplitude of the primary current can be determined.

The outputs of the current transducer 96 and the voltage transducer 94 represent, respectively, the amplitudes of the current and voltage waveforms in the conductors 100, 101 supplying the load 84. In the digital power meter 80, the outputs of the voltage 94 and current 96 transducers are input to analog-to-digital converters (ADC) 104, 106. The ADCs 104, 106 comprise a sample and hold section 108 and a quantizer section 110. The sample and hold section 108 keeps the voltage at the input to the quantizer section 110 constant while the analog-to-digital conversion is taking place, that is, the output of the sample and hold section is allowed to change only at periodic intervals at which time the quantizer input becomes identical to the instantaneous value of the input signal from the respective voltage 94 or current 96 transducer. Changes in the input signals from the voltage 94 and current 96 transducers that occur between these sampling instances are ignored. Sampling converts the independent variable of the waveform equation, time, from a continuum to a plurality of discrete moments. In the quantizer section 110 of the ADC 104, 106, the value of the dependent variable, the input voltage or current signal, respectively, is quantized and converted to a discrete digital number for each of the discrete sampling moments.

The outputs of the ADCs 104, 106 are read by a data processing system. In the typical digital power meter, the data processing system comprises a sampling unit data processor, typically a microprocessor or digital signal processor (DSP), that is dedicated to the task of reading and storing the digital number quantifying each of the current and voltage sample values and a second data processor, including program instructions, data storage and peripheral devices, that is adapted to read the stored digital sample values and calculate the current, voltage, power, and other electrical parameters that are output by the power meter. A 3-phase power meter commonly includes a sampling unit for each of the three phases and each sampling unit typically comprises a voltage transducer, a current transducer, ADCs, and a sampling unit data processor. However, providing a data processor dedicated to the tasks of sampling the voltage and current adds unnecessary data processing capabilities and costs to the power meter if the sampling can be controlled and performed by the data processor that performs the other functions of the power meter, such as calculating the electrical parameters to be output by the meter.

Figure 4:
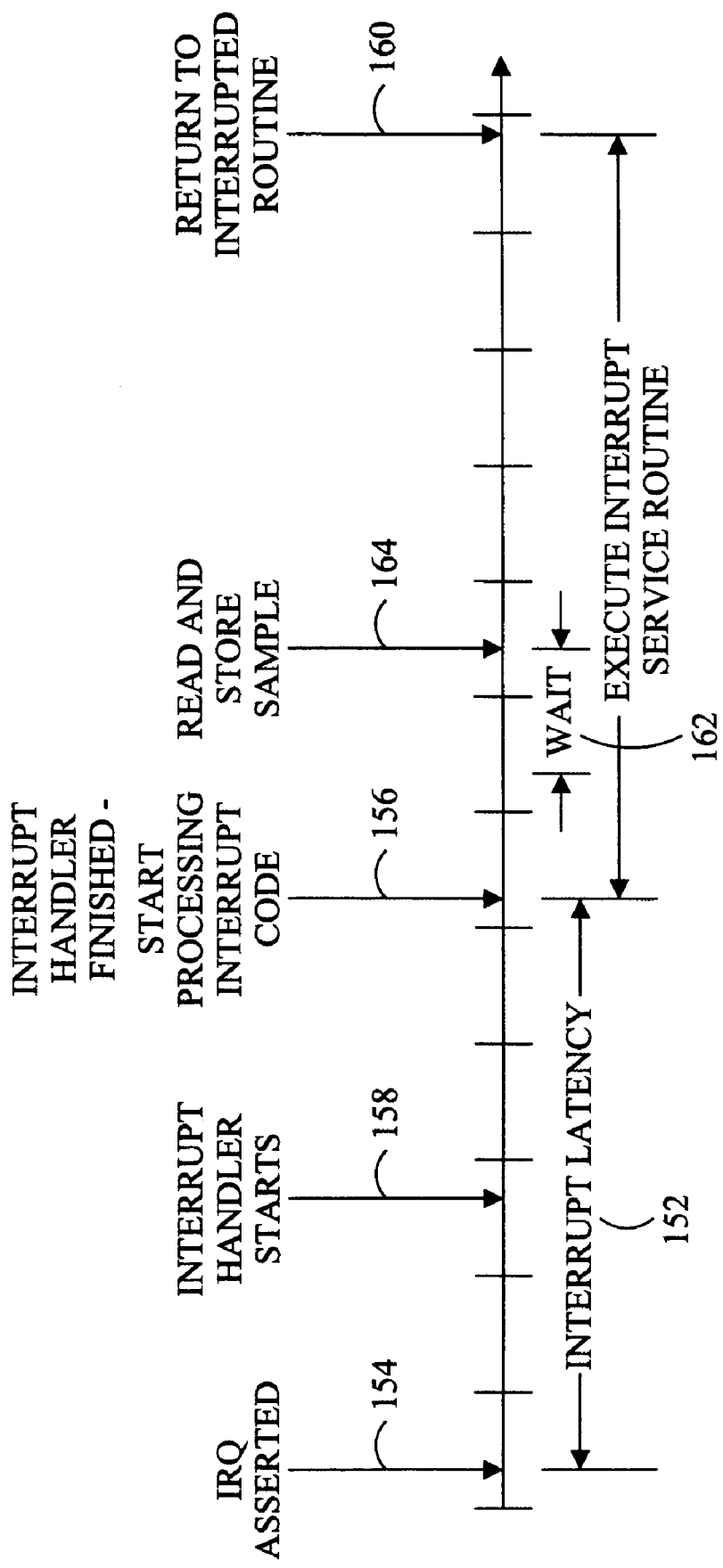
FIG. 4 is pictorial representation of an exemplary interrupt process.

While the processing power of microprocessors has increased substantially and microprocessors are commonly used to perform multiple tasks, interrupts are commonly utilized to switch between tasks that may occur coincidently and interrupt latency is problematic when performing real-time tasks. A microprocessor responds to an interrupt request signal, usually from external hardware, by suspending processing of a lower priority task, storing pointers to the interrupted program instructions and any intermediate results of the suspended task, and initiating processing of the program instructions of the interrupt service routine, the program instructions, for the higher priority interrupting task. Upon completion of the interrupting task, the microprocessor returns to the interrupted task and, unless a higher priority, second interrupt has been received, continues processing the interrupted task. Referring to FIG. 4, interrupt latency refers to the time interval 152 between the assertion of an interrupt request 154 and the initiation of the program instructions of the interrupt service routine for the asserted interrupt 156. Interrupt latency varies with the architecture of the microprocessor and the operation being performed when an interrupt request is asserted. As result, timing of the initiation of the interrupt process is uncertain and timely performance of real-time tasks, such as sampling, is unreliable. However, the applicant concluded that a microprocessor could be used to perform the real-time task of sampling, as well as other tasks required for a power meter, if a signal to initiate a high priority interrupt was issued in anticipation of the latency of the interrupt so that the microprocessor was prepared to immediately read the sample value from the ADC at the instant of time appropriate for sampling.

In the power meter 80, the outputs of the ADCs 104, 106 that sample and digitize the outputs of the voltage 94 and current 96 transducers is read by a data processing device 112, typically, a microprocessor, programmable logic device (PLC), or digital signal processor. The device is part of a data processing system comprising the data processing device 112, program instructions, and related data storage and peripheral devices. The data processing system includes a memory 118 that is adapted to store instructions and data (e.g., number of turns in the secondary winding, voltage sample values, current sample values, etc.) used by the data processing device in calculating the current, voltage, power, and other related electrical parameters. The data processing device 112 is also connected to a display system 120 permitting display of the metered quantities. A user interface may be incorporated in the display section permitting manual selection of different metered quantities for display. Other peripheral devices, components, and features may be provided including, for example, a communications interface 122 that enables remote reporting of the meter results or transmission of instrument data to a remote data processing system.

The data processing device 112 includes an interrupt handler 114 providing an interface for assertion of an interrupt request (IRQ) signal by a device such as a sampling timer 124. While interrupts commonly originate with devices external to the associated data processing device, the sampling timer 124 may be an external device or may be created internally in the data processor and its memory 118. When an IRQ is asserted 152, operation of the interrupt handler 114 is initiated 158. The interrupt handler 114 determines the priority of the interrupt and that the asserted interrupt can not be masked, delayed until completion of some current task. Since sampling is performed in real time, the sampling interrupt is typically designated as a non-maskable, high priority interrupt. The interrupt handler 114 routes the interrupt signal to the core of the microprocessor which typically saves the addresses of the next instruction and any intermediate results for the interrupted program, disables lower priority interrupts, and jumps to the starting address or interrupt vector of the interrupt service routine, the program instructions for the interrupting task. When the interrupt handler 156 has finished, the microprocessor is ready to perform the first instruction of the interrupt service routine containing an instruction for reading and storing the output of at least one of the ADCs 104, 106. When the data processing device 112 has completed the program instructions of the interrupt service routine, it recovers the addresses related to the instructions and data for the interrupted task and begins executing the interrupted task 160.

Figure 5:
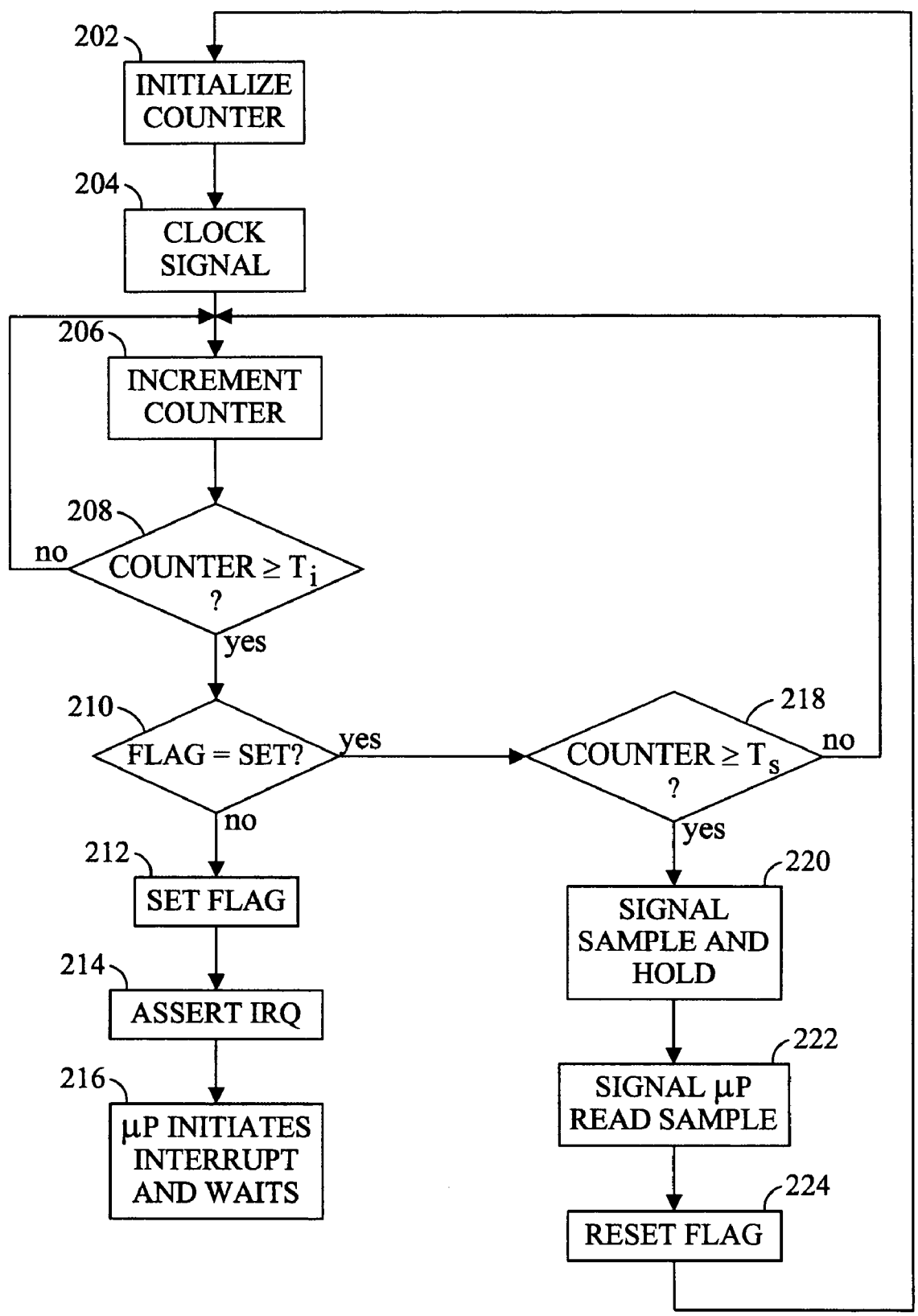
FIG. 5 is a block diagram of a method of waveform sampling utilizing an interrupt.

Referring to FIG. 5, in the power meter 80, the interrupt request signal to initiate the sampling interrupt is provided by the sampling timer 124. The sampling interrupt process 200 begins with initialization of a counter 202 of the sampling timer 124 by the data processing device 112. A clock 126, which may be an external clock or the internal clock providing timing signals to the data processing device, provides timing signals to the sample timer 124. When a clock signal is received 204 from the clock 126 the counter is incremented 206. The accumulated count of the counter is compared to a first set time ($t_i$) for asserting the sampling interrupt request with the data processing device 208. The time for asserting the interrupt request for the sampling interrupt 154 is at least equal to the difference between the sampling interval and the sum of the interrupt latency 152 and any time required to execute program instructions of the sampling interrupt service routine that are to be executed before the data processing device 112 is ready to read and store the output of the ADCs.

If the time corresponding to the clock signal count accumulated on the counter has not reached the interrupt request initiation time 208, the counter continues to increment in response to clock signals. However, if the time has reached the interrupt request initiation time 208 and a flag has not been set indicating that the interrupt request has been asserted 210, the interrupt request flag is set 212, and the interrupt request is asserted 214 at the data processor 112. The interrupt handler 114 is started 158 initiating the interrupt process by storing addresses for instructions and data for the interrupted task and obtaining the interrupt vector for the interrupt service routine for the sampling interrupt. The interrupt handler finishes and the data processing device may begin processing the sampling interrupt service routine if additional action is necessary to prepare the data processing device to read sample values 216. In response to a program instruction in the sampling interrupt service routine, the data processing device 112 pauses 162 in anticipation of a second signal from the sampling timer 216.

The counter continues to increment 206 in response to signals from the clock 204 and, since the interrupt request flag is set 210, the time corresponding to the accumulated clock signal count is compared to the sampling interval 218. When the time corresponding to the accumulated clock signal count on the counter equals a second set value, the sampling interval 218, a signal is sent to the sample and hold sections 108 of the ADCs 104, 106 to hold the input to the quantizer 110 at the current value of the respective outputs of the voltage 94 and current 96 transducers 220. The signal also causes the data processing device 112 to execute the program instructions of the sampling interrupt service routine to cause the data processing device to read and store the digital outputs of at least one of the ADCs 222. The data processing device reads and stores the ADC outputs for the sample 164 and completes the sampling interrupt service routine before returning to the interrupted task 160. The sampling signal from the counter also resets the interrupt request flag 224 and initializes the counter 202 to begin timing the next sampling interval.

By asserting an interrupt request in anticipation of a period of latency preceding readiness of the data processing device to sample the voltage and current, the data processing device of a power meter can utilize an interrupt to reliability perform real-time sampling in conjunction with performing other tasks related to the power meter's operation.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:

1. An electric power meter comprising:
    (a) a quantizer including a quantizer input and a quantizer output, said quantizer converting an instantaneous amplitude of an analog signal at said quantizer input to a digital amplitude signal at said quantizer output, said analog signal representing one of a voltage waveform and a current waveform;
    (b) a sampler to capture and hold an instantaneous amplitude of said analog signal at said quantizer input in response to assertion of a sampling signal;
    (c) a data processor to read said digital amplitude signal at said quantizer output in response to execution by said data processor of a program instruction included in an interrupt service routine, said data processor initiating an interrupt process including a period of interrupt latency in response to assertion of an interrupt request, and executing said program instruction to read said digital signal in response to assertion of said sampling signal; and
    (d) a sampling timer asserting said interrupt request and said sampling signal, said interrupt request being asserted a time period at least as great as said interrupt latency prior to assertion of said sampling signal.

2. The electric power meter of claim 1 wherein said interrupt request is asserted prior to assertion of said sampling signal by an interval at least equal to said period of interrupt latency.

3. An electric power meter comprising:
    (a) a quantizer including a quantizer input and a quantizer output, said quantizer converting an instantaneous amplitude of an analog signal at said quantizer input to a digital amplitude signal at said quantizer output, said analog signal representing one of a voltage waveform and a current waveform;
    (b) a sampler to capture and hold an instantaneous amplitude of said analog signal at said quantizer input in response to assertion of a sampling signal;
    (c) a data processor to read said digital amplitude signal at said quantizer output in response to execution by said data processor of a program instruction included in an interrupt service routine, said data processor initiating an interrupt process including a period of interrupt latency in response to assertion of an interrupt request, and executing said program instruction to read said digital signal in response to assertion of said sampling signal;
    (d) a sampling timer asserting said interrupt request and said sampling signal, said interrupt request being asserted prior to assertion of said sampling signal;
    (e) wherein said sampling timer asserting said interrupt request and said sampling signal comprises a counter incremented by a timing signal, outputting an interrupt request signal to said data processor upon expiration of an interrupt initiation interval, and outputting a sampling signal to said data processor upon expiration of a sampling interval; expiration of said interrupt initiation interval preceding expiration of said sampling interval by an interval at least equal to an interrupt latency.

* * * * *